(12) United States Patent
Hu et al.

(10) Patent No.: US 10,275,685 B2
(45) Date of Patent: Apr. 30, 2019

(54) PROJECTION-BASED AUDIO OBJECT EXTRACTION FROM AUDIO CONTENT

(71) Applicant: DOLBY LABORATORIES LICENSING CORPORATION, San Francisco, CA (US)

(72) Inventors: Mingqing Hu, Beijing (CN); Lie Lu, San Francisco, CA (US); Lianwu Chen, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/538,306

(22) PCT Filed: Dec. 18, 2015

(86) PCT No.: PCT/US2015/066798
§ 371 (c)(1),
(2) Date: Jun. 21, 2017

(87) PCT Pub. No.: WO2016/106145
PCT Pub. Date: Jun. 30, 2016

(65) Prior Publication Data
US 2017/0344852 A1 Nov. 30, 2017

Related U.S. Application Data

(60) Provisional application No. 62/108,254, filed on Jan. 27, 2015.

(30) Foreign Application Priority Data

Dec. 22, 2014 (CN) .......................... 2014 1 0814973

(51) Int. Cl.
*G06F 17/00* (2006.01)
*G06K 9/62* (2006.01)
(Continued)

(52) U.S. Cl.
CPC ............. *G06K 9/624* (2013.01); *G06F 17/15* (2013.01); *H03H 21/00* (2013.01); *H04S 5/00* (2013.01);
(Continued)

(58) Field of Classification Search
CPC .................................. G06K 9/624; H04S 5/00
See application file for complete search history.

(56) References Cited

U.S. PATENT DOCUMENTS 7,120,626 B2   10/2006   Li
7,636,662 B2   12/2009   Dimtrova
(Continued)

FOREIGN PATENT DOCUMENTS

CN    101021849    8/2007
CN    101617360    12/2009
(Continued)

OTHER PUBLICATIONS

Cristani M., "Statistical generative modelling of audio-video sequences for scene analysis", Ph.D. Thesis, Universita degli Studi di Verona, Dipartimento di Informatica, Series No. TD-03-06, Apr. 11, 2006, pp. 1-125.
(Continued)

*Primary Examiner* — Joseph Saunders, Jr.

(57) ABSTRACT

A method is disclosed for audio object extraction from an audio content which includes identifying a first set of projection spaces including a first subset for a first channel and a second subset for a second channel of the plurality of channels. The method may further include determining a first set of correlations between the first and second channels, each of the first set of correlations corresponding to one of the first subset of projection spaces and one of the second subset of projection spaces. Still further, the method may include extracting an audio object from an audio signal of
(Continued)

the first channel at least in part based on a first correlation among the first set of correlations and the projection space from the first subset corresponding to the first correlation, the first correlation being greater than a first predefined threshold. Corresponding system and computer program products are also disclosed.

13 Claims, 2 Drawing Sheets

(51) Int. Cl.
*H04S 5/00* (2006.01)
*G06F 17/15* (2006.01)
*H03H 21/00* (2006.01)

(52) U.S. Cl.
CPC .. *H03H 2021/0034* (2013.01); *H04S 2400/03* (2013.01); *H04S 2400/11* (2013.01)

(56) References Cited

U.S. PATENT DOCUMENTS

| | | |
|---|---|---|
| 8,229,134 B2 | 7/2012 | Duraiswami |
| 8,532,306 B2 | 9/2013 | Oh |
| 2009/0198356 A1 | 8/2009 | Goodwin |
| 2010/0125352 A1 | 5/2010 | Yamada |
| 2011/0191113 A1 | 8/2011 | Large |
| 2013/0275128 A1 | 10/2013 | Claussen |
| 2014/0098981 A1 | 4/2014 | Lunner |

FOREIGN PATENT DOCUMENTS

| | | |
|---|---|---|
| CN | 102004549 | 4/2011 |
| CN | 102521368 | 8/2013 |
| WO | 2011/092549 | 8/2011 |
| WO | 2012/146823 | 11/2012 |
| WO | 2013/017985 | 2/2013 |
| WO | 2013/177751 | 12/2013 |
| WO | 2015/081070 | 6/2015 |

OTHER PUBLICATIONS

Izadinia H. et al., "Multimodal Analysis for Identification and Segmentation of Moving-Sounding Objects", IEEE Transactions on Multimedia, vol. 15, Issue 2, pp. 378-390, Nov. 20, 2012.
Huang, G. et al., "Canonical Correlation Analysis Using for DOA Estimation of Multiple Audio Sources", Computational Intelligence and Bioinspired Systems (Lecture Notes in Computer Science; LNCS), pp. 857-864, Jun. 18, 2005.
Kenichi K. et al., "Channel selection based on multichannel cross-correlation coefficients for distant speech recognition", Hands-free Speech Communication and Microphone arrays (HSCMA), 2011 Joint Workshop on. IEEE, pp. 1-6, XP031957298, May 30, 2011.
Pezeshki A. et al., "Undersea Target Classification Using Canonical Correlation Analysis", IEEE Journal of Oceanic Engineering, IEEE Service Center, Piscataway NJ, vol. 32 No. 4, pp. 948-955, XP011203629, Oct. 1, 2007.
Magnus B., "Canonical Correlation-A Tutorial", pp. 1-12, XP055251847, Jan. 12, 2001.

PROJECTION-BASED AUDIO OBJECT EXTRACTION FROM AUDIO CONTENT

CROSS-REFERENCE TO RELATED APPLICATIONS

This application claims priority from Chinese Priority Application No. 201410814973.9 filed 22 Dec. 2014 and U.S. Provisional Patent Application No. 62/108,254 filed 27 Jan. 2015, which are hereby incorporated by reference in their entirety.

TECHNOLOGY

Example embodiments disclosed herein generally relate to audio content processing and more specifically, to a method and system for audio object extraction from the audio content.

BACKGROUND

Traditionally, the audio content is created and stored in channel-based formats. In a channel-based format, the audio content is usually represented, stored, conveyed and distributed by the vehicle of the channel. As used herein, the term "audio channel" or "channel" refers to the audio content that usually has a predefined physical location. For example, stereo, surround 5.1, surround 7.1 and the like are all in channel-based formats for the audio content. Each channel corresponds to a fixed-position physical speaker. When multi-channel content is played back, multiple speakers create a live and immersive sound field around a listener. Recently, several conventional multichannel systems have been extended to support a new format that includes both channels and audio objects. As used herein, the term "audio object" or "object" refers to an individual audio element that exists for a defined duration of time in a sound field. For example, audio objects may represent dialogues, gunshots, thunders, and the like. These objects are usually used by mixers to create their desired sound effects. Each object has its positions in the sound field. For example, a dialogue is usually located in the central front and the sound of thunder is usually emanating from overhead. The perception of the positions of an object by human being is the result of firing of multiple speakers which are playing the audio signals of the same object. For example, when an object is played by a front-left speaker and a front-right speaker with similar energy levels, a person will perceive a phantom from the central front.

As mentioned above, when content is created in a channel-based format, it usually means that a perception experience is optimized by mixers for the specific playback setting. However, when played by a different playback setting, its listening experience could degrade due to the mismatch between playback settings. An example of degradation is that the positions of an object could be changed. Thus, the channel-based format is inefficient to adapt to a variety of speaker playback configurations. Another aspect of inefficiency lies in binaural rendering, in which the channel-based format can only use a limited number of head-related transfer functions (HRTFs) specific to speaker positions; while for other positions, the interpolation of HRTFs is used, degrading the binaural listening experience.

One potential way to address this issue is to recover the original sources (or objects), including their positions and mono clean waveform, from channel-based representations, and then use the positions as metadata to steer the panning algorithm of a speaker playback device to re-render the objects on the fly and create a similar sound image to the original ones. For a binaural rendering setting (instead of using a limited number of HRTFs), the positions could be used to choose the most appropriate HRTFs to further enhance the listening experience.

However, an object in channel-based representations, which is to be rendered with metadata, is not always clean. It could be mixed simultaneously with other objects, within some channels. For example, in order to implement an artistic intention, a mixer could put two objects simultaneously in front of a listener, one object appearing between the center and the front left and the other at some position between the center and the front right. This could make the central front channel contain two objects. If no source separation techniques are used, these two objects would be regarded as one object, which would make their position estimations incorrect.

Thus, in order to get a clean object and estimate its positions, source separation techniques are needed to separate the object from its multi-channel mixture to produce a clean multi-channel or mono representation. In the above-mentioned example, a single multi-channel input is desired to be split by the source separation component, for example, into two multi-channels or mono outputs, each only containing one clean object.

SUMMARY

In order to address the foregoing and other potential problems, the example embodiments disclosed herein proposes a method and system for extracting audio objects from an audio content.

In one aspect, example embodiments provide a method for audio object extraction from an audio content, with the audio content being represented by audio signals of a plurality of channels. The method includes identifying a first set of projection spaces including a first subset for a first channel and a second subset for a second channel of the plurality of channels. The method further includes determining a first set of correlations between the first and second channels, each of the first set of correlations corresponding to one of the first subset of projection spaces and one of the second subset of projection spaces. The method also includes extracting an audio object from an audio signal of the first channel at least in part based on a first correlation among the first set of correlations and the projection space from the first subset corresponding to the first correlation, the first correlation being greater than a first predefined threshold. Embodiments in this regard further include a corresponding computer program product.

In another aspect, example embodiments provide a system for audio object extraction from an audio content, the audio content being represented by audio signals of a plurality of channels. The system includes an identifying unit configured to identify a first set of projection spaces including a first subset for a first channel and a second subset for a second channel of the plurality of channels. The system further includes a determining unit configured to determine a first set of correlations between the first and second channels, each of the first set of correlations corresponding to one of the first subset of projection spaces and one of the second subset of projection spaces. The system also includes an extracting unit configured to extract an audio object from an audio signal of the first channel at least in part based on a first correlation among the first set of correlations and the projection space from the first subset corresponding to the first correlation, the first correlation being greater than a first predefined threshold.

Through the following description, it would be appreciated that in accordance with example embodiments disclosed herein, audio objects can be separated from each of the audio signals of an audio content based on multiple channels. In this way, it is possible for an audio content input to adapt to a variety of playback configurations, without degrading the listening experience. Other advantages achieved by example embodiments will become apparent through the following descriptions.

DESCRIPTION OF DRAWINGS

Through the following detailed description with reference to the accompanying drawings, the above and other objectives, features and advantages of example embodiments will become more comprehensible. In the drawings, several example embodiments will be illustrated in an example and non-limiting manner, wherein.

Throughout the drawings, the same or corresponding reference symbols refer to the same or corresponding parts.

DESCRIPTION OF EXAMPLE EMBODIMENTS

Figure 1:
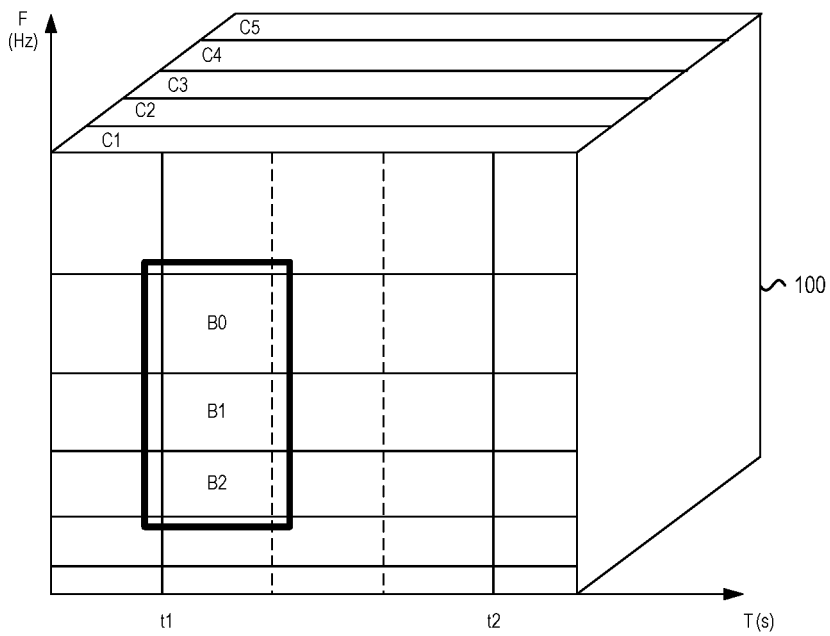
FIG. 1 illustrates an example of a segment of audio signal of a format based on a plurality of channels.

Principles of the example embodiments will now be described with reference to various example embodiments illustrated in the drawings. It should be appreciated that the depiction of these embodiments is only to enable those skilled in the art to better understand and further implement the example embodiments, not intended for limiting the scope of the example embodiments disclosed herein in any manner. It also should be appreciated that the terms "first," "second" and the like are used to indicate different objects, without suggesting any limitations as to the sequence of the objects.

As mentioned above, a legacy channel-based audio content is insufficient to adapt to a variety of playback settings. Specifically, when a playback setting mismatches the mixer's configuration, the listening experience represented by the playback setting will be degraded. Moreover, representing the audio content with the playback setting while preserving the artistic intension also brings a challenge for objects separation technique.

Therefore, it is desired to extract audio objects as clean as possible from a channel-based audio content. FIG. 1 illustrates an example of a segment of audio signal of a format based on a plurality of channels. As shown in FIG. 1, the segment of audio signal 100 is represented in time and frequency domains. In the time domain which is represented by the horizontal axis, the segment of audio signal 100 may contain several frames along the timeline T. A frame may be, for example, a time length from t1 to t2. For the convenience of the subsequent calculation and process in object extraction, a frame of audio signal may be further divided (shown by the dash lines in FIG. 1) along the timeline into multiple portions. On the other hand, in the frequency domain which is represented by the vertical axis, the segment of audio signal 100 represents a full band signal which can also be divided into multiple sub-bands along the frequency domain for the convenience of subsequent calculation and process in object extraction as well. Many available spectral transformation techniques may be applied in the sub-bands division, such as Fast Fourier Transformation (FFT) or Complex Quadrature Mirror Filter (CQMF). Considering the characteristics of human auditory system, the division in the frequency domain may not be even, but finer in low frequency part and coarser in high frequency part. As shown in FIG. 1, the audio signal 100 is related to a plurality of channels, for example, channels C1 to C5. In other words, the input audio signal 100 comprises multiple audio signal components, each of which corresponds to one of the channels C1 to C5. Therefore, the audio content herein may be, based on multiple channels, a segment of full band audio signal or sub-band audio signal. The segment, without limitation, may be a frame, a part of a frame, two frames or more. In some example embodiments, the audio content may comprise one or more audio blocks that are obtained by dividing a frame of full band audio signal in at least one of a frequency domain and a time domain. In accordance with example embodiments, if object extraction is desired to be performed on one audio block, for example, block B1, its upper neighboring m block(s) and lower neighboring m block(s) are typically taken into account. In some example embodiments, m may be set to 1. At this point, blocks B0 to B2, each of which being based on channels C1 to C5, are taken into account together and the whole of them constitute the audio content to be processed.

Figure 2:
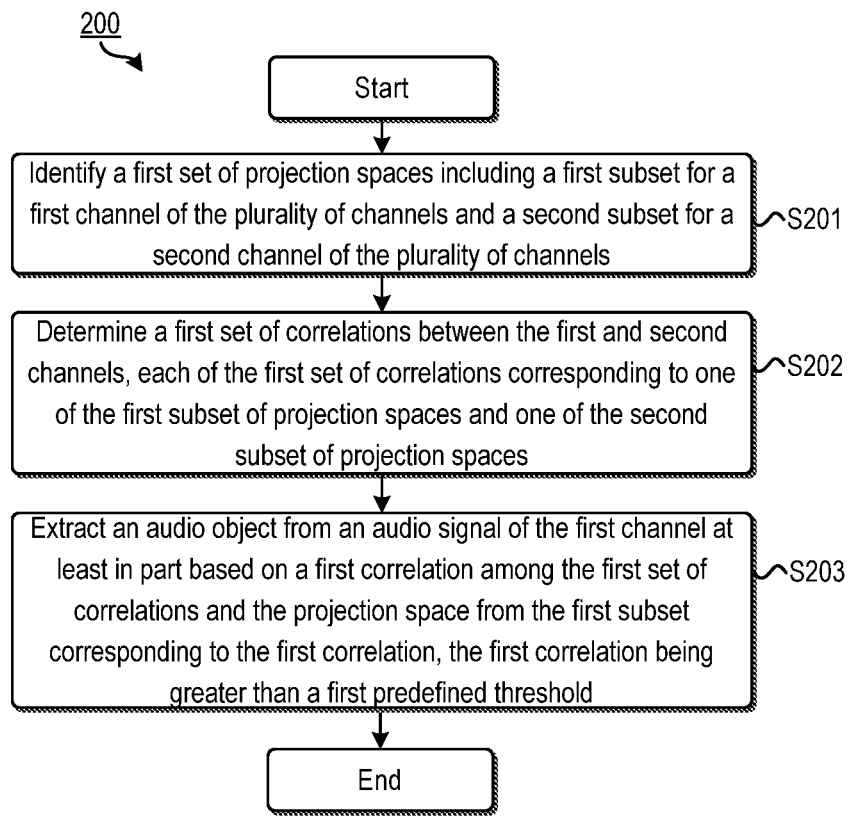
FIG. 2 illustrates a flowchart of a method for audio object extraction from an audio content in accordance with example embodiments.

FIG. 2 illustrates a flowchart of a method 200 for audio object extraction from an audio content in accordance with example embodiments. As mentioned above, the audio content is represented by audio signals of a plurality of channels.

As shown, at step S201, a first set of projection spaces including a first subset for a first channel and a second subset for a second channel of the plurality of channels are identified. In some example embodiments, the first and the second channels may be arbitrary channels of the plurality of channels; while in other example embodiments, they may be selected based on some criteria, which will be illustrated later.

As known, the audio signal of a channel may be projected to various spaces to obtain respective components. For the sake of illustration and without limitation, suppose matrices $X \in R^{d \times n}$ and $Y \in R^{k \times n}$ are generated respectively for the audio signal representations of the first and the second channels of the audio content, where d and k represent a number of sub-band division(s) along the frequency line contained in the respective audio signal (typically d=k) and n represents a number of portions divided along the timeline in the audio signal. That is, X and Y represent the audio signal of the audio content from the first and the second channels respectively. Then projection vectors $\omega_x$ and $\omega_y$ can be used to project X and Y to respective projection spaces, where $\omega_x \in R^d$ and $\omega_y \in R^k$. In other words, $\omega_x^T X$ and $\omega_y^T Y$ may represent the components projected in the respective projection spaces for X and Y, where $\omega_x^T$ and $\omega_y^T$ are respective transpositions of $\omega_x$ and $\omega_y$. Furthermore, for multiple $\omega_x$, there are correspondingly multiple spaces obtained by projecting X using each $\omega_x$. The set of these multiple spaces is referred to as the first subset for the first channel of step S201 for ease to distinguish and without limitation. Likewise, for multiple $\omega_y$, there are also correspondingly multiple spaces obtained by projecting Y using each $\omega_y$. The set of these multiple spaces is referred to as the second subset for the second channel of step S201 for ease to distinguish and without limitation. In some examples, the union of the first subset and the second subset constitutes the first set of projection spaces.

It should be noted that although the first set of projection spaces normally comprises multiple projection spaces for the first and second channels, it may comprise only one space as well. In this case, the projection space for X and that for Y are the same one. The scope of the example embodiments are not limited in this regard.

The method then proceeds to step S202, where a first set of correlations between the first and the second channels are determined, and each of the first set of correlations is corresponding to one of the first subset of projection spaces and one of the second subset of projection spaces.

After the first set of projection spaces which includes the first subset of projection spaces and the second subset of projection spaces is identified, a pair of projection spaces can be chosen out respectively from the first subset of projection spaces and the second subset of projection spaces based on some criteria to facilitate the object extraction. In accordance with example embodiments, specifically, suppose a common object exists in both X and Y but contaminated by other sources or noises, it is desired to find respective projection spaces for X and Y in which the common objects are more easily separated from X or Y.

According to example embodiments, a correlation is calculated for each pair of projection spaces, with one of the pair of projection spaces being chosen out from the first subset while the other one of the pair of projection spaces is chosen out from the second subset, thereby forming the set of correlations (namely, the first set of correlations of step S202). For example, the correlation $\rho$ between X and Y with respect to $\omega_x$ and $\omega_y$ may be calculated as follows:

$$\rho = \frac{\omega_x^T X Y^T \omega_y}{\sqrt{(\omega_x^T X X^T \omega_x)(\omega_y^T Y Y^T \omega_y)}} \quad (1)$$

where meanings of $\omega_x$ and $\omega_y$ remain the same as illustrated above, $\omega_x \in R^d$ and $\omega_y \in R^k$.

With continuing reference to FIG. 2, at step S203, an audio object is extracted from an audio signal of the first channel at least in part based on a first correlation among the first set of correlations and the projection space from the first subset corresponding to the first correlation, wherein the first correlation is greater than a first predefined threshold.

In accordance with example embodiments, the first predefined threshold can be set and adjusted at any time as desired. In an example embodiment, the first predefined threshold can be set as merely smaller than the maximum correlation but greater than the other correlations in the first set of correlations. In this case, the objective at step S203 is to find the maximum $\rho$, so as to further identify $\omega_x$ and $\omega_y$ for object extraction. Therefore, it is intended in step S203 to $$\max_{\omega_x, \omega_y} \omega_x^T X Y^T \omega_y \quad (2)$$

subject to $\omega_x^T X X^T \omega_x = 1, \omega_y^T Y Y^T \omega_y = 1,$ where $X^T$, $Y^T$, $\omega_x^T$, $\omega_y^T$, are respective transpositions of X, Y, $\omega_x$, $\omega_y$.

If $YY^T$ is nonsingular, it can be shown that $\omega$, can be obtained by solving the following optimization problem:

$$\max_{\omega_x} \omega_x^T X Y^T (YY^T)^{-1} Y X^T \omega_x \quad (3)$$

subject to $\omega_x^T X X^T \omega_x = 1$

In other words, the above equation attempts to find the eigenvectors corresponding to the top eigenvalues of the following generalized eigenvalue problem:

$$X Y^T (YY^T)^{-1} Y X^T \omega_x = \eta X X^T \omega_x \quad (4)$$

where $\eta$ represents the eigenvalue corresponding to the eigenvector $\omega_x$.

As mentioned above, according to some example embodiments, there may be multiple projection vectors $\omega_x$ and $\omega_y$, typically under orthonormality constraints. Then these multiple projection vectors can be computed simultaneously by solving the following optimization problem:

$$\max_{W_x} \text{trace}\left(W_x^T X Y^T (YY^T)^{-1} Y X^T W_x\right) \quad (5)$$

subject to $W_x^T X X^T W_x = I$ where $W_x \in R^{d \times d}$ represents the projection matrix, $W_x = [\omega_x^1, \ldots, \omega_x^l]$, l represents the number of projection vectors, and I represents the identity matrix.

In summary, for audio inputs of the first and the second channels, $W_x$, $W_y$ and corresponding correlations R between them are determined for preparations of the object extraction, where $W_x = [\omega_x^1, \ldots, \omega_x^l]$, and either $\omega_x^i$ or $\omega_y^i$ represents a column vector, which can be used as a basis of a projection space. R represents a square correlation matrix with only nonzero elements (namely, $\rho$) in its diagonal. For the i-th nonzero diagonal element $\rho_i$ in R, it measures the similarity score between $\omega_x^{iT} X$ and $\omega_y^{iT} Y$. It should be noted that either $\omega_x^{iT} X$ or $\omega_y^{iT} Y$ represents an n-dimensional vector, where n is the number of portions within a segment of audio signal. Thus, this measurement reflects the similarity in the audio content on the basis of audio blocks. As mentioned above, by projecting X and Y to their respective projection spaces in which the components of X and Y show a high correlation therebetween, a high similarity between X and Y can be observed, and the common object between X and Y may be extracted accordingly.

For example, for the i-th projection space, object $X_i^*$ may be recovered from X via the following equation:

$$X_i^* = \omega_x^i \omega_x^{iT} X \quad (6)$$

Then, for the $W_x$ consisting of l projection vectors (corresponding to l projection spaces from the first subset), $X^*$ may be calculated in the following alternative equations:

$$F = W_x H W_x^T \quad (7)$$

$$X^* = FX \quad (8)$$

where H is introduced to represent a diagonal weighting matrix with nonzero elements on its diagonal and all of its off-dialogue elements being zero. The introduction of H is beneficial to differentiating the contributions of projection vectors to the recovery of $X^*$. Specifically, for a certain pair of projection spaces, the more similar X and Y are, the higher the H will be. As a result, the more X s and Y s can be extracted respectively in the certain pair of projection spaces.

In accordance with example embodiments disclosed herein, one potential approach to determine the diagonal values of H is to set them dependent on the correlation matrix R. As mentioned above, a diagonal element of R reflects the similarity between a pair of channels that are mapped into projection spaces built by a column vector of W (for example, Wx or Wy). Thus, a higher similarity score indicates a greater probability that the same object exists and can be recovered from these spaces. Thus, it is reasonable to extract "more" objects from those spaces having high similarity scores, that is, H could be steered by an appropriate function of R, namely, $$H=f(R) \qquad (9)$$

where the function $f$ could be any function, whose value doesn't decrease with the increasing input value. For example, H can be a normalized R, where the sum of the diagonal elements is equal to one.

As mentioned above, the first and the second channels may be arbitrary channels of the plurality of channels. That is, although the object extraction from the audio signal of the first channel at step S203 is shown to be performed with respect to the second channel, it may be substantively performed with respect to any channel from the plurality of the channels. Moreover, although it is described at step S203 of the audio object extraction for the audio signal of the first channel, similar operations may also be applied to the second channel to perform the object extraction for the audio signal of the second channel as well. That is, the object extraction for the audio signal of the second channel may be performed with respect to the first channel, or any other channel from the plurality of the channels, which is not detailed here for the sake of brevity. The scope of the example embodiments are not limited in this regard.

Alternatively, in some example embodiments, the first and the second channels may be selected based on some criteria. For example, both channels may be selected from a channel group which is obtained by clustering the plurality of channels based on correlations thereof. In some example embodiments, a correlation between a pair of channels of the plurality of channels herein refers to a general correlation between the pair of channels. For example, this correlation between the pair of channels of the plurality of channels may be obtained by the following steps:

First, a second set of projection spaces for the pair of channels are identified which includes a third subset for one of the pair of channels and a fourth subset for the other of the pair of channels. As an example, this step can be implemented in a way similar to step S201 and is not detailed here. It should be noted that the second set of projection spaces may be different from the first set of projection spaces although in some cases they may be the same.

Then, a second set of correlations between the pair of channels are then determined, wherein each of the second set of correlations corresponds to one of the third subset of projection spaces and one of the fourth subset of projection spaces. Also, this step may be implemented in a similar way to step S202. For example, for matrices X and Y that are respectively generated from the audio signal of each of the pair of channels, equation (1) is used to calculate each of the second set of correlations. Again, the first set of correlations and the second set of correlations are normally different for different pairs of channels.

Next, one of the second set of correlations is selected as the correlation between the pair of channels, wherein the selected correlation is greater than a second predefined threshold. This selection step may be implemented in a way similar to the selection of the first correlation in step S203 and is not detailed here. For example, it may be implemented via equations (2)-(5). The second predefined threshold may also be set and adjusted at any time as desired. In an example embodiment, the second predefined threshold may be set as merely smaller than the maximum correlation in the second set of correlations but greater than the other correlations. In this case, this step selects the maximum correlation in the second set of correlations as the correlation between the pair of channels.

After the correlations of the plurality of channels are calculated, in accordance with some example embodiments, channels with correlations there between greater than a predefined threshold can be clustered into one group. This predefined threshold can be interpreted as the minimum allowed relative similarity score between clusters, and can be set to a constant value over time. As a result, channels that are clustered into one group show a high intra-group similarity; while channels that are clustered into different groups show a low inter-group similarity. Therefore, audio signals of channels from one group usually have a common object, and related components (namely, the audio object of step S203) of the common object can be extracted via step S201-S203 for each channel so as to generate a multi-channel object, which will be detailed later. In some example embodiments, the number of channel groups is automatically determined when the clustering procedure terminates. It should be noted that if channels of the plurality of channels are similar to each other, or correlations between each pair of the plurality of channels are all greater than the predefined threshold, the plurality of channels may be regarded as a single group.

In accordance with some example implementations, clustering the plurality of channels based on correlations of the plurality of channels may be performed by the following procedures:

Initialization: set a pre-defined threshold, calculate a pair-wise similarity matrix S, where the entry $S_{ij}$ denotes the similarity between the i-th and j-th channels, and initialize each channel as a cluster, namely, $C_1, \ldots, C_T$, where T represents the number of channels.

Loop

Calculate an intra-cluster similarity score for each cluster by averaging the pair-wise similarity scores of channels within the cluster, that is, $$s_{intra}(m) = \frac{\sum_{i \in C_m} \sum_{j \in C_m} s_{ij}}{N_m},$$

where $N_m$ represents the number of pairs of the m-th cluster.

Calculate an absolute inter-cluster similarity score for each pair of clusters by averaging the pair-wise similarity scores of channels respectively lying in their own clusters, namely, $$s_{inter}(m, n) = \frac{\sum_{i \in C_m} \sum_{j \in C_n} s_{ij}}{N_{mn}},$$

where $N_{nm}$ represents the number of pairs between the m-th and n-th clusters.

Calculate a relative inter-cluster similarity score for each pair of clusters by dividing the absolute inter-cluster score by the means of two intra-cluster similarity scores, namely, $$s_{rela}(m, n) = \frac{s_{inter}(m, n)}{0.5 \times (s_{intra}(m) + s_{intra}(n))}$$

Find a pair of clusters with a maximum relative inter-cluster similarity score. If the maximum score is less than the pre-defined threshold, terminate the loop; otherwise, merge these two clusters into one cluster.
End In accordance with some example embodiments, in the case that the first channel belongs to a group that comprises three channels or more, there are multiple candidates for the second channel. Suppose the channel group consisting of q channels $[I_1, \ldots, I_{i-1}, I_i, I_{i+1}, \ldots, I_q]$ is identified. For the $I_i$-th channel, there are q−1 candidate W, that is, $W_{I_i}^{(I_1,J_i)}, \ldots, W_{I_i}^{(I_{i-1},J_i)}, W_{I_i}^{(I_{i+1},J_i)}, \ldots, W_{I_i}^{(I_q,J_i)}$ for the audio object extraction of the $I_i$-th channel. Thus, it needs a criterion to select a W from these candidates.

As mention above, in some example embodiments, the second channel may be an arbitrary or random channel among them. Otherwise, in some other example embodiments, the selection of the second channel from the channel group may be performed such that the audio signal of the second channel has a maximum energy in the channel group. In other words, the most dominant channel can be selected as the second channel. Thus, the object extraction for the first channel, as well as for other channels within the group, may all be performed with respect to the second channel (namely, the most dominant channel).

As described above, the object extraction for the audio signal of the second channel may be performed with respect to the first channel, or any other channel from the plurality of the channels. As an alternative, according to some example embodiments and without limitation, in the case that the second channel has a maximum energy in the channel group, it is possible to select a reference channel, instead of simply choosing the first channel, for the object extraction for the audio signal of the second channel. For example, the channel whose correlation with the second channel is greater than a third predefined threshold can be selected as the reference channel. The third predefined threshold can be set and adjusted at any time as desired. In an example embodiment, the third predefined threshold may be set as merely smaller than the maximum correlation in the channel group but greater than the other correlations. In this case, the channel that is most correlated to the second channel is selected as the reference channel. And steps S201 to S203 of method 200 can be applied to the second channel and the reference channel for audio object extraction of audio signal of the second channel.

If, in some example embodiments, the first channel is selected such that the correlation between the first and second channels is greater than a third predefined threshold, it can be the reference channel in this case. Therefore, an audio object may be extracted from the audio signal of the second channel at least in part based on the first correlation and the projection space from the second subset corresponding to the first correlation as obtained in step S203 of method 200.

As illustrated above with respect to FIG. 2, the audio objects can be extracted for each channel in various projection spaces. Therefore, in some examples, a multi-channel object can be generated based on the audio objects extracted from audio signals of channels from one channel group. In accordance with some further embodiments, it would be beneficial to introduce a "soft-gating" procedure to verify and to adjust the object extraction.

Specifically, the "soft-gating" procedure is introduced to alleviate the risks that in some cases the playback of a type of object might deviate from the loyalty to the original representations. In order to conduct the "soft-gating" procedure, for example, a gain vector $g_b$ can be determined as below:

Firstly, a multi-channel object is generated at least in part based on the extracted audio objects from audio signals of the first and second channels. In accordance with example embodiments, generally, the multi-channel object may be generated based on the audio objects extracted from audio signals of channels from one channel group.

Secondly, the generated multi-channel object can be down-mixed to a mono-representation using any known method in the art. A down-mix similarity between the mono-representation and an original multi-channel representation of the extracted object is next determined. For example, the down-mix similarity can be calculated as below:

$$s_b^{(i)} = \left| \frac{\text{Re}\left(\sum_t M_i(b, t) \times X_i(b, t)^*\right)}{\sqrt{\sum_t \|M_i(b, t)\|^2} \sqrt{\sum_t \|X_i(b, t)\|^2}} \right| \quad (10)$$

where $X_i(b,t)$ is the representations of the i-th channel, $M_i(b,t)$ is the down-mixed mono representations, $X_i(b,t)^*$ is the conjugate of $X_i(b,t)$, the $\| \|$ is the absolute value of a complex number, and the operation of Re( ) means real part. b and t respectively denote the sub-band index and the time portion index, namely, respective index in the frequency domain and the time domain. The overall down-mix similarity score between the mono representations and original ones can be calculated via $$s_b = \frac{1}{T}\sum_{i=1}^{T} s_b^{(i)} \quad (11)$$

or alternatively via $$s_b = \max_i s_b^{(i)} \quad (12)$$

The gain value $g_b$ steered by the down-mix similarity $s_b$, namely, $g_b^{(1)}$, can be represented by:

$$g_b^{(1)} = f(s_b) \quad (13)$$

It is appreciated that the function $f(x)$ is a mono increasing function with x. One example of definition of $f$ can be written in the following formula:

$$f(x) = \frac{1}{1 + \exp(a \times (x - b))} \quad (14)$$

By setting the value of a as negative, $f(x)$ becomes a mono increasing function with x.

In accordance with some example embodiments, the calculated gain value may be applied to equation (6) or (7) as a weight to affect the object extraction of X. That is, in extracting an audio object from the audio signal of the first channel at step S203, as well as from the audio of any other channel in the channel group that the first channel belongs to, the down-mix similarity calculated via equations (10)-(12) is also a factor to be considered in addition to the first correlation or the corresponding projection space. In other words, extracting the audio object from the audio signal of the first channel at step S203 further comprises extracting the audio object based on the down-mix similarity. Therefore equation (6) is transformed into:

$$X_i^* = \omega_x^i g_b^{(1)} \omega_x^{iT} X \tag{15}$$

Equation (7) is transformed into:

$$F' = g_b^{(1)} F \tag{16}$$

And equation (8) is transformed into:

$$X^* = F'X \tag{17}$$

In addition to or instead of the gain value $g_b^{(1)}$ steered by the down-mix similarity $s_b$, according to example embodiments, the gain vector $g_b$ can also be determined by the following steps: after a multi-channel object is generated at least in part based on the extracted audio objects from audio signals of the first and second channels, the generated multi-channel object is down-mixed to a mono representation. Then, the mono representation can be pre-rendered at least in part based on the related metadata, such as estimated positions, to generated a "new" (namely, different from the original multi-channel object) multi-channel audio signal representation. Subsequently, a pre-rendered similarity between the pre-rendered mono representation (namely, the new multi-channel audio signal representation) and the original multi-channel representation of the extracted object in terms of an energy distribution is determined.

In some example implementations, this pre-rendered similarity is possible to be reflected by a mismatch between the energy distribution of the original multi-channel object and the one resulted from the pre-rendering of the mono object. That is, the more the mismatch is, the less the pre-rendered similarity is. Therefore, a suitable metric measuring the mismatch can be appropriately designed as:

$$d_b = \sum_{i=1}^{T} |e_b^i - e_b^{*i}| \tag{18}$$

or, alternatively, as $$d_b = \max_i |e_b^i - e_b^{*i}| \tag{19}$$

where $e_b^i$ and $e_b^{*i}$ respectively denote the normalized energy distribution of the legacy content and the one resulted from the pre-rendering of the mono object together with the estimated metadata by using a renderer, and b and i respectively denote the sub-band index and the channel index, namely, the respective index in the frequency domain and the channel domain. It should be noted that the channel configuration of pre-rendering with the renderer is the same as that of legacy content. For example, for surround 5.1 legacy content, the channel configuration of pre-rendering should also be surround 5.1. The normalized energy distribution can be calculated via the following equation.

$$e_b^i = \frac{E_b^i}{\sum_{i=1}^{T} E_b^i} \tag{20}$$

where $E_b^i$ denotes the b-th sub-band energy for the i-th channel.

Therefore, the gain value $g_b$ steered by $d_b$ (namely, $g_b^{(2)}$) can be represented as:

$$g_b^{(2)} = f(d_b) \tag{21}$$

where $f(d_b)$ is a mono decreasing function with $d_b$.

In some example embodiments, this gain value $g_b^{(2)}$ may also be applied to equation (6) or (7) as a weight to affect the object extraction of X. That is, in extracting an audio object from the audio signal of the first channel at step S203 (as well as from the audio of any other channel in the channel group that the first channel belongs to), the mismatch, which reflects the pre-rendered similarity and is calculated via equations (18)-(19), is also a factor to be considered in addition to the first correlation or the corresponding projection space; or to the first correlation, the corresponding projection space and the down-mix similarity. That is, the extracting the audio object from the audio signal of the first channel at step S203 further comprises extracting the audio object based on the pre-rendered similarity. Then equation (6) is transformed into:

$$X_i^* = \omega_x^i g_b^{(2)} \omega_x^{iT} X \tag{22}$$

or $$X_i^* = \omega_x^i g_b^{(2)} g_b^{(1)} \omega_x^{iT} X \tag{23}$$

Equation (7) is transformed into:

$$F'' = g_b^{(2)} F \tag{24}$$

or $$F'' = g_b^{(1)} \times g_b^{(2)} F \tag{25}$$

And equation (8) is transformed into:

$$X^* = F''X \tag{26}$$

The introduction of at least one of the gain vectors $g_b^{(1)}$ and $g_b^{(2)}$, associated with the down-mix similarity and the pre-rendered similarity respectively, may verify whether the playback of the extracted objects deviates from the loyalty to the original representations, and whether the playback of the extracted objects preserves the artistic intentions. The deviation, if any, can at least indicate that there is a timbre mismatch, for example, between the mono-representation and the original multichannel representation. Therefore, the transformed equations (15), (17), (22), (23) and (26) can reduce the deviation by introducing the factor of $g_b^{(1)}$ or $g_b^{(2)}$.

Figure 3:
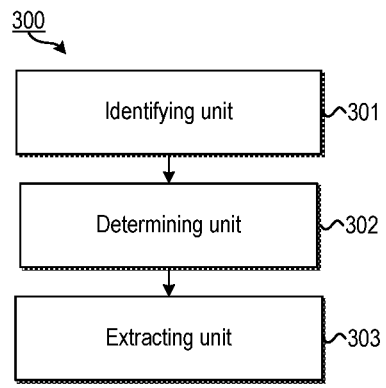
FIG. 3 illustrates a block diagram of a system 300 for audio object extraction from the audio content in accordance with one example embodiment.

FIG. 3 illustrates a block diagram of a system 300 for the audio object extraction from the audio content in accordance with one example embodiment. Herein the audio content is represented by audio signals of a plurality of channels. As shown, the system 300 comprises an identifying unit 301 configured to identify a first set of projection spaces including a first subset for a first channel of the plurality of channels and a second subset for a second channel of the plurality of channels. The system 300 further comprises a determining unit 302 configured to determine a first set of correlations between the first and second channels, with each of the first set of correlations corresponding to one of the first subset of projection spaces and one of the second subset of projection spaces. The system 300 also comprises an extracting unit 303 configured to extract an audio object from an audio signal of the first channel at least in part based on a first correlation among the first set of correlations and the projection space from the first subset corresponding to the first correlation, with the first correlation being greater than a first predefined threshold.

In some embodiments, the system 300 may further comprise a selecting unit configured to select the first and second channels from a channel group, the channel group obtained by clustering the plurality of channels based on correlations of the plurality of channels.

In some embodiments, a correlation between a pair of channels of the plurality of channels is determined by: identifying a second set of projection spaces including a third subset for one of the pair of channels and a fourth subset for the other of the pair of channels; determining a second set of correlations between the pair of channels, each of the second set of correlations corresponding to one of the third subset of projection spaces and one of the third subset of projection spaces; and selecting one of the second set of correlations as the correlation between the pair of channels, the selected correlation being greater than a second predefined threshold.

In some embodiments, the selection of the first and second channels from the channel group may comprise selecting the second channel from the channel group such that the audio signal of the second channel has a maximum energy in the channel group.

In some embodiments, the selection of the first and second channels from the channel group may further comprise selecting the first channel from the channel group, such that the correlation between the first and second channels is greater than a third predefined threshold; and extracting, from an audio signal of the second channel, an audio object at least in part based on the first correlation and the projection space from the second subset corresponding to the first correlation.

In some embodiments, the system 300 further comprises a generating unit configured to generate a multi-channel object at least in part based on the extracted audio objects from audio signals of the first and second channels; a down-mixing unit configured to down-mix the generated multi-channel object to a mono representation; and a similarity determining unit configured to determine a down-mix similarity between the mono representation and an original multi-channel representation of the extracted object, wherein the extracting the audio object from the audio signal of the first channel comprises extracting the audio object further based on the down-mix similarity.

In some alternative embodiments, the system 300 may further comprises a generating unit configured to generate a multi-channel object at least in part based on the extracted audio objects from audio signals of the first and second channels; a down-mixing unit configured to down-mix the generated multi-channel object to a mono representation; a pre-rendering unit configured to pre-render the mono representation at least in part based on estimated positions; and a similarity determining unit configured to determine a pre-rendered similarity between the pre-rendered mono representation and an original multi-channel representation of the extracted object in terms of an energy distribution, wherein extracting the audio object from the audio signal of the first channel comprising extracting the audio object further based on the pre-rendered similarity.

In some embodiments, the audio content may comprise one or more audio blocks that are obtained by dividing a frame of full-band audio signal in at least one of a frequency domain and a time domain.

For the sake of clarity, some optional components of the system 300 are not shown in FIG. 3. However, it should be appreciated that the features as described above with reference to FIGS. 1-2 are all applicable to the system 300. Moreover, the components of the system 300 may be a hardware module or a software unit module. For example, in some embodiments, the system 300 may be implemented partially or completely as software and/or in firmware, for example, implemented as a computer program product embodied in a computer readable medium. Alternatively or additionally, the system 300 may be implemented partially or completely based on hardware, for example, as an integrated circuit (IC), an application-specific integrated circuit (ASIC), a system on chip (SOC), a field programmable gate array (FPGA), and so forth. The scope of the example embodiments are not limited in this regard.

Figure 4:
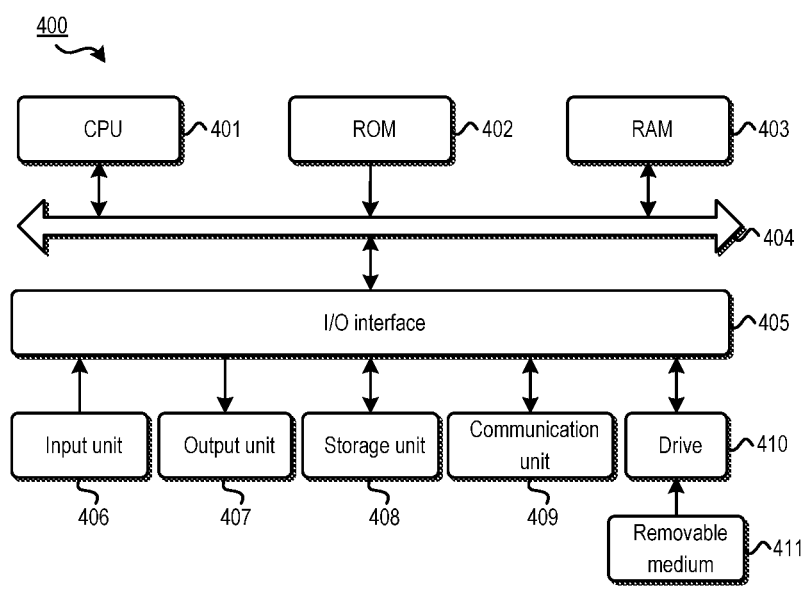
FIG. 4 illustrates a block diagram of an example computer system suitable for implementing example embodiments.

FIG. 4 shows a block diagram of an example computer system 400 suitable for implementing example embodiments. As shown, the computer system 400 comprises a central processing unit (CPU) 401 which is capable of performing various processes in accordance with a program stored in a read only memory (ROM) 402 or a program loaded from a storage unit 408 to a random access memory (RAM) 403. In the RAM 403, data required when the CPU 401 performs the various processes or the like is also stored as required. The CPU 401, the ROM 402 and the RAM 403 are connected to one another via a bus 404. An input/output (I/O) interface 405 is also connected to the bus 404.

The following components are connected to the I/O interface 405: an input unit 406 including a keyboard, a mouse, or the like; an output unit 407 including a display such as a cathode ray tube (CRT), a liquid crystal display (LCD), or the like, and a loudspeaker or the like; the storage unit 408 including a hard disk or the like; and a communication unit 409 including a network interface card such as a LAN card, a modem, or the like. The communication unit 409 performs a communication process via the network such as the internet. A drive 410 is also connected to the I/O interface 405 as required. A removable medium 411, such as a magnetic disk, an optical disk, a magneto-optical disk, a semiconductor memory, or the like, is mounted on the drive 410 as required, so that a computer program read therefrom is installed into the storage unit 408 as required.

Specifically, in accordance with example embodiments, the processes described above with reference to FIG. 2 may be implemented as computer software programs. For example, embodiments of the example embodiments include a computer program product including a computer program tangibly embodied on a machine readable medium, the computer program including program code for performing method 200. In such embodiments, the computer program may be downloaded and mounted from the network via the communication unit 409, and/or installed from the removable medium 411.

Generally speaking, various example embodiments may be implemented in hardware or special purpose circuits, software, logic or any combination thereof. Some aspects may be implemented in hardware, while other aspects may be implemented in firmware or software which may be executed by a controller, microprocessor or other computing devices. While various aspects of the example embodiments are illustrated and described in block diagrams, flowcharts, or using some other pictorial representation, it will be appreciated that the blocks, apparatus, systems, techniques or methods described herein may be implemented in, as non-limiting examples, hardware, software, firmware, special purpose circuit or logic, general purpose hardware or controller or other computing devices, or some combination thereof.

Additionally, various blocks shown in the flowcharts may be viewed as method steps, and/or as operations that result from the operation of computer program code, and/or as a plurality of coupled logic circuit elements constructed to carry out the associated function(s). For example, embodiments include a computer program product comprising a computer program tangibly embodied on a machine readable medium, the computer program containing program codes configured to carry out the methods as described above.

In the context of the disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out the methods of the example embodiments disclosed herein may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer, or entirely on the remote computer or server.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any embodiment or of what may be claimed, but rather as descriptions of features that may be specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination.

Various modifications and adaptations to the foregoing example embodiments disclosed herein may become apparent to those skilled in the relevant arts in view of the foregoing description, when read in conjunction with the accompanying drawings. Any and all modifications will still fall within the scope of the non-limiting and example embodiments disclosed herein. Furthermore, other embodiments set forth herein will come to the mind of one skilled in the art to which these example embodiments pertain having the benefit of the teachings presented in the foregoing descriptions and the drawings.

The example embodiments may be embodied in any of the forms described herein. For example, the following enumerated example embodiments (EEEs) describe some structures, features, and functionalities of some aspects of the example embodiments.

EEE 1. A method for an audio object extraction from an audio content, the audio content being of a format based on a plurality of channels, the method comprising:
　object extraction through a filter matrix derived from projection spaces; and optionally,
　soft-gating to apply an additional gain on the extracted object or the filter matrix to preserve the artistic intention EEE 2. The method according to EEE 1, wherein for each audio block to perform object extraction,
　generating a projection vector set for each channel input, and the maximum correlation (similarity score) between each pair of channels are computed by projecting them to projection spaces;
　grouping the channels based on the corresponding correlation (similarity scores);
　for each channel within the group, deriving a filter matrix for each audio block; and
　recovering an object by multiplying input audio signal of each channel by its own filter matrix
　wherein the audio block is obtained by dividing a frame of full-band audio signal in at least one of a frequency domain and a time domain.

EEE 3. The method according to EEE 2, wherein the projection vector set is formed on a block basis by using current audio block and neighboring audio blocks.

EEE 4. The method according to EEE 3, wherein the generation of a filter matrix F involves the choice of W and H, where
　the choice of H can be made via the equation (9); and
　the choice of W involves the identification of a second channel within a group.

EEE 5. The method according to EEE 4, wherein the identification of a second channel is based on channel energy, e.g., the channel having maximal energy among a group is selected.

EEE 6. The method according to EEE 4, wherein the choice of W for a first channel is to select a projection vector set with respect to the second channel.

EEE 7. The method according to EEE 4, wherein the choice of W for the second channel, is to select a projection vector set with respect to the channel, among the group, showing a maximal similarity to the second channel.

EEE 8. The method according to EEE 1, wherein the soft-gating step involves the generation of a gain vector for each audio block; and the gain vector is multiplied by the audio signal input in a block-wise manner to produce an output.

EEE 9. The method according to EEE 8, wherein the gain vector is calculated as the product of two sub gain vectors, namely, equation (22), respectively generated from pre-down-mixing operations and pre-rendering operations.

EEE 10. The method according to EEE 9, wherein the sub gain vector from pre-down-mixing operations can be calculated by equations (10) (13).

EEE 11. The method according to EEE 9, wherein the sub gain vector from pre-rendering operations can be calculated by equations (17) (20).

EEE 12. A system for an audio object extraction from an audio content, the audio content being in a format based on a plurality of channels, the system comprising units configured to carry out the method of any of EEEs 1 to 11.

EEE 13. A computer program product for an audio object extraction from an audio content, the computer program product being tangibly stored on a non-transient computer-readable medium and comprising machine executable instructions which, when executed, cause the machine to perform steps of the method of any of EEEs 1 to 11.

It will be appreciated that the example embodiments disclosed herein are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for audio object extraction from an audio content, the audio content being represented by audio signals of a plurality of channels, the method comprising:
    clustering the plurality of channels based on correlations of the plurality of channels to thereby obtain a channel group;
    selecting first and second channels from the channel group;
    identifying a first set of projection spaces including a first subset for the first channel and a second subset for the second channel;
    determining a first set of correlations between the first and second channels, each of the first set of correlations corresponding to one of the first subset of projection spaces and one of the second subset of projection spaces;
    identifying a first correlation among the first set of correlations that has a maximum value among the first set of correlations; and
    extracting an audio object from an audio signal of the first channel at least in part based on the first correlation and the projection space from the first subset corresponding to the first correlation,
    wherein the audio content comprises one or more audio blocks that are obtained by dividing a frame of full-band audio signal in at least one of a frequency domain and a time domain.

2. The method of claim 1, wherein a correlation between a pair of channels of the plurality of channels is determined by:
    identifying a second set of projection spaces including a third subset for one of the pair of channels and a fourth subset for the other of the pair of channels;
    determining a second set of correlations between the pair of channels, each of the second set of correlations corresponding to one of the third subset of projection spaces and one of the fourth subset of projection spaces; and
    selecting one of the second set of correlations as the correlation between the pair of channels, the selected correlation being greater than a second predefined threshold.

3. The method of claim 1, wherein selecting the first and second channels from the channel group comprises:
    selecting the second channel from the channel group such that the audio signal of the second channel has a maximum energy in the channel group.

4. The method of claim 3, wherein selecting the first and second channels from the channel group further comprises:
    selecting the first channel from the channel group, such that the correlation between the first and second channels is greater than a third predefined threshold; and
    extracting, from an audio signal of the second channel, an audio object at least in part based on the first correlation and the projection space from the second subset corresponding to the first correlation.

5. The method of claim 1, further comprising verifying and adjusting the object extraction by:
    generating a multi-channel object at least in part based on the extracted audio objects from audio signals of the first and second channels;
    down-mixing the generated multi-channel object to a mono representation;
    determining a down-mix similarity between the mono representation and an original multi-channel representation of the extracted object; and
    extracting the audio object from the audio signal of the first channel at least in part based on the first correlation among the first set of correlations and the projection space from the first subset corresponding to the first correlation, and further based on the down-mix similarity.

6. The method of claim 1, further comprising verifying and adjusting the object extraction by:
    generating a multi-channel object at least in part based on the extracted audio objects from audio signals of the first and second channels;
    down-mixing the generated multi-channel object to a mono representation;
    pre-rendering the mono representation at least in part based on estimated positions; determining a pre-rendered similarity between the pre-rendered mono representation and an original multi-channel representation of the extracted object in terms of an energy distribution; and
    extracting the audio object from the audio signal of the first channel at least in part based on the first correlation among the first set of correlations and the projection space from the first subset corresponding to the first correlation, and further based on the pre-rendered similarity.

7. A computer program product, comprising a computer program tangibly embodied on a non-transitory machine readable medium, the computer program containing program code for performing the method according to claim 1.

8. A system for audio object extraction from an audio content, the audio content being represented by audio signals of a plurality of channels, the system comprising:
    a selecting unit configured to select first and second channels from a channel group, the channel group obtained by clustering the plurality of channels based on correlations of the plurality of channels;
    an identifying unit configured to identify a first set of projection spaces including a first subset for the first channel and a second subset for the second channel;

a determining unit configured to determine a first set of correlations between the first and second channels, each of the first set of correlations corresponding to one of the first subset of projection spaces and one of the second subset of projection spaces; and an extracting unit configured to identify a first correlation among the first set of correlations that has a maximum value among the first set of correlations, and to extract an audio object from an audio signal of the first channel at least in part based on the first correlation and the projection space from the first subset corresponding to the first correlation, wherein the audio content comprises one or more audio blocks that are obtained by dividing a frame of full-band audio signal in at least one of a frequency domain and a time domain.

9. The system of claim 8, wherein a correlation between a pair of channels of the plurality of channels is determined by:

identifying a second set of projection spaces including a third subset for one of the pair of channels and a fourth subset for the other of the pair of channels;

determining a second set of correlations between the pair of channels, each of the second set of correlations corresponding to one of the third subset of projection spaces and one of the fourth subset of projection spaces; and selecting one of the second set of correlations as the correlation between the pair of channels, the selected correlation being greater than a second predefined threshold.

10. The system of claim 8, wherein selecting the first and second channels from the channel group comprises:

selecting the second channel from the channel group such that the audio signal of the second channel has a maximum energy in the channel group.

11. The system of claim 10, wherein selecting the first and second channels from the channel group further comprises:

selecting the first channel from the channel group, such that the correlation between the first and second channels is greater than a third predefined threshold; and extracting, from an audio signal of the second channel, an audio object at least in part based on the first correlation and the projection space from the second subset corresponding to the first correlation.

12. The system of claim 8, further comprising:

a generating unit configured to generate a multi-channel object at least in part based on the extracted audio objects from audio signals of the first and second channels;

a down-mixing unit configured to down-mix the generated multi-channel object to a mono representation; and a similarity determining unit configured to determine a down-mix similarity between the mono representation and an original multi-channel representation of the extracted object, wherein the extracting unit is configured to re-extract the audio object from the audio signal of the first channel at least in part based on the first correlation among the first set of correlations and the projection space from the first subset corresponding to the first correlation, and further based on the down-mix similarity.

13. The system of claim 8, further comprising:

a generating unit configured to generate a multi-channel object at least in part based on the extracted audio objects from audio signals of the first and second channels;

a down-mixing unit configured to down-mix the generated multi-channel object to a mono representation;

a pre-rendering unit configured to pre-render the mono representation at least in part based on estimated positions; and a similarity determining unit configured to determine a pre-rendered similarity between the pre-rendered mono representation and an original multi-channel representation of the extracted object in terms of an energy distribution, wherein the extracting unit is configured to re-extract the audio object from the audio signal of the first channel at least in part based on the first correlation among the first set of correlations and the projection space from the first subset corresponding to the first correlation, and further based on the pre-rendered similarity.

* * * * *